United States Patent
Mann

(10) Patent No.: US 9,146,472 B2
(45) Date of Patent: Sep. 29, 2015

(54) MICROLITHOGRAPHY PROJECTION SYSTEM WITH AN ACCESSIBLE DIAPHRAGM OR APERTURE STOP

(71) Applicant: Carl Zeiss SMT GmbH, Oberkochen (DE)

(72) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/080,224

(22) Filed: Nov. 14, 2013

(65) Prior Publication Data

US 2014/0071414 A1  Mar. 13, 2014

Related U.S. Application Data

(63) Continuation of application No. 13/173,560, filed on Jun. 30, 2011, now Pat. No. 8,614,785, which is a continuation of application No. 11/851,852, filed on Sep. 7, 2007, now Pat. No. 7,999,913, which is a
(Continued)

(51) Int. Cl.
    *G03F 7/20* (2006.01)
    *G02B 17/06* (2006.01)

(52) U.S. Cl.
    CPC ........ *G03F 7/70058* (2013.01); *G02B 17/0647* (2013.01); *G03F 7/708* (2013.01); *G03F 7/7025* (2013.01); *G03F 7/70233* (2013.01); *G03F 7/70258* (2013.01); *G03F 7/70275* (2013.01)

(58) Field of Classification Search
    CPC ............ G02B 17/0647; G03F 7/70058; G03F 7/70233; G03F 7/7025; G03F 7/70258; G03F 7/70275; G03F 7/708; G03F 7/70808; G03F 7/70833
    USPC ................. 250/492.2; 355/53, 55, 60, 66, 67; 359/359, 364–366, 850, 857–859, 861
    See application file for complete search history.

(56) References Cited

U.S. PATENT DOCUMENTS

| 4,701,035 A | 10/1987 | Hirose |
| 5,686,728 A | 11/1997 | Shafer |

(Continued)

FOREIGN PATENT DOCUMENTS

| EP | 0 955 641 A1 | 3/1999 |
| EP | 1 413 909 | 4/2004 |

(Continued)

OTHER PUBLICATIONS

Bal, Matthieu Frédéric, dissertation "Next-Generation Extreme Ultraviolet Lithographic Projection Systems", pp. 1-139, (Feb. 10, 2003).

(Continued)

*Primary Examiner* — Steven H Whitesell Gordon
(74) *Attorney, Agent, or Firm* — Fish & Richardson P.C.

(57) ABSTRACT

The invention relates to a microlithography projection lens for wavelengths <=248 nm <=, preferably <=193 mm, in particular EUV lithography for wavelengths ranging from 1-30 nm for imaging an object field in an object plane onto an image field in an image plane, the microlithography projection lens developed in such a manner that provision is made for an accessible diaphragm plane, into which for instance an iris diaphragm can be introduced.

21 Claims, 9 Drawing Sheets

Figure 1:
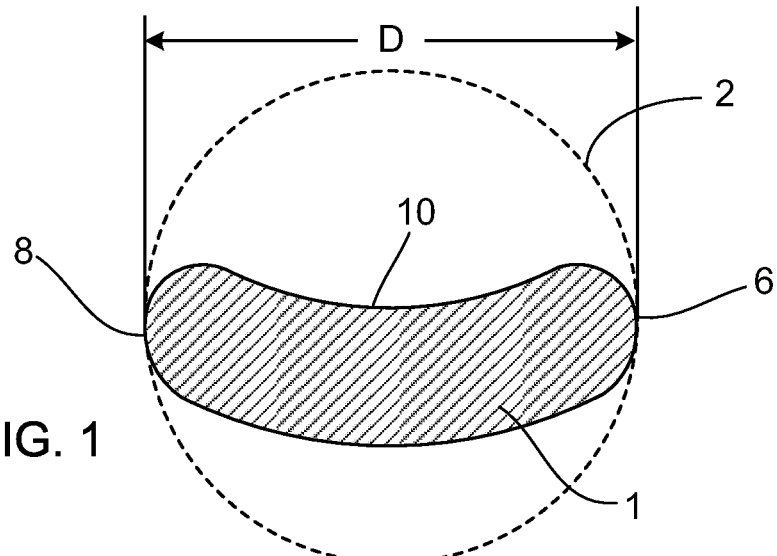

Related U.S. Application Data continuation of application No. PCT/EP2006/002005, filed on Mar. 4, 2006.

(60) Provisional application No. 60/659,660, filed on Mar. 8, 2005.

(56) References Cited

U.S. PATENT DOCUMENTS

| | | | |
|---|---|---|---|
| 5,956,192 A * | 9/1999 | Williamson | 359/859 |
| 5,973,826 A * | 10/1999 | Chapman et al. | 359/355 |
| 6,142,641 A | 11/2000 | Cohen et al. | |
| 6,172,825 B1 | 1/2001 | Takahashi | |
| 6,198,793 B1 | 3/2001 | Schultz et al. | |
| 6,213,610 B1 | 4/2001 | Takahashi et al. | |
| 6,255,661 B1 | 7/2001 | Braat | |
| 6,302,548 B2 | 10/2001 | Takahashi et al. | |
| 6,353,470 B1 * | 3/2002 | Dinger | 355/71 |
| 6,556,648 B1 | 4/2003 | Bal et al. | |
| 6,600,552 B2 | 7/2003 | Dinger | |
| 6,781,671 B2 | 8/2004 | Komatsuda | |
| 7,130,018 B2 | 10/2006 | Terasawa | |
| 7,999,913 B2 | 8/2011 | Mann | |
| 8,614,785 B2 | 12/2013 | Mann | |
| 2002/0018309 A1 * | 2/2002 | Braat | 359/856 |
| 2002/0129328 A1 | 9/2002 | Komatsuda | |
| 2002/0154395 A1 * | 10/2002 | Mann et al. | 359/364 |
| 2002/0176063 A1 | 11/2002 | Omura | |
| 2003/0076483 A1 | 4/2003 | Komatsuda | |
| 2003/0147130 A1 | 8/2003 | Terasawa | |
| 2003/0147131 A1 | 8/2003 | Terasawa | |
| 2003/0147149 A1 | 8/2003 | Terasawa | |
| 2004/0051857 A1 | 3/2004 | Hudyma et al. | |
| 2004/0125353 A1 | 7/2004 | Takahashi | |
| 2004/0189965 A1 | 9/2004 | Takahashi | |
| 2004/0189968 A1 | 9/2004 | Terasawa | |
| 2004/0218163 A1 | 11/2004 | Sasaki et al. | |
| 2006/0012767 A1 | 1/2006 | Komatsuda | |
| 2006/0232867 A1 | 10/2006 | Mann et al. | |
| 2006/0262277 A1 | 11/2006 | Takahashi | |
| 2008/0024746 A1 | 1/2008 | Mann | |
| 2011/0261338 A1 | 10/2011 | Mann | |

FOREIGN PATENT DOCUMENTS

| | | |
|---|---|---|
| JP | S 61-123812 | 6/1986 |
| JP | 2000-100694 | 4/2000 |
| JP | 2001-185480 | 7/2001 |
| JP | 2002-107630 | 4/2002 |
| JP | 2002-139672 | 5/2002 |
| JP | 2003-015040 | 1/2003 |
| JP | 2003-107354 | 4/2003 |
| JP | 2004-140390 | 5/2004 |
| JP | 2004-214242 | 7/2004 |
| JP | 2004-325649 | 11/2004 |
| WO | WO 2004/010224 | 1/2004 |
| WO | WO 2006/001291 | 1/2006 |
| WO | WO 2006/087978 | 8/2006 |

OTHER PUBLICATIONS

European office action for EP Application No. 10002198.9, dated Apr. 14, 2011.

Japanese Office Action, corresponding to Japanese Application No. 2008-500101, dated Dec. 19, 2011.

Japanese Office Action, with English translation thereof, for JP Appl No. P2012-137567, dated Aug. 25, 2014.

Japanese Office Action, with translation thereof, for corresponding JP Appl No. 2012-137567, dated Oct. 15, 2013.

* cited by examiner

MICROLITHOGRAPHY PROJECTION SYSTEM WITH AN ACCESSIBLE DIAPHRAGM OR APERTURE STOP

CROSS-REFERENCE TO RELATED APPLICATIONS

This application is a continuation of, and claims benefit to U.S. Application No. 13/173,560, filed Jun. 30, 2011, which is a continuation of U.S. Application No. 11/851,852, filed Sep. 7, 2007, now U.S. Pat. No. 7,999,913, which is a continuation of International Application No. PCT/EP2006/002005, filed Mar. 4, 2006, which claims benefit to U.S. Provisional Application No. 60/659,660, filed Mar. 8, 2005. The contents of these applications are hereby incorporated by reference in its entirety.

BACKGROUND OF THE INVENTION

1. Field of the Invention

The invention relates to a microlithography projection system, a projection exposure system and a chip manufacturing method.

2. Description of Related Art

Lithography employing wavelengths ≤248 nm, preferably ≤193 nm, in particular EUV lithography employing $\lambda=11$ nm and/or $\lambda=13$ nm, is discussed as a possible technique for imaging structures <130 nm, or more highly preferable <100 nm. The resolution of a lithographic system is described by the following equation:

$$RES = k_1 \cdot \frac{\lambda}{NA},$$

where $k_1$ designates a specific parameter of the lithographic process, $\lambda$ the wavelength of the incident light and NA the image-side numerical aperture of the system.

The optical components of EUV imaging systems are essentially reflective systems employing multilayer coatings. Mo/Be systems are the preferred multilayer coating systems employed for $\lambda=11$ nm and Mo/Si systems for $\lambda=13$ nm. Lithography with wavelengths below 11 nm is possible.

In order to achieve the highest resolution possible, it is necessary for the system to have an image-side aperture that is as large as possible.

It is an advantage for a lithographic system if the optical path within a projection system or projection lens is free of vignetting or obscuration. The disadvantage of systems with a vignetted exit pupil, e.g. so-called Schwarzschild mirror systems, is that structures of a particular magnitude can only be imaged with reduced contrast. The exit pupil is defined as the image of the aperture stop, imaged by a microlithography projection system located in the optical path between the aperture stop and the image plane.

For instance, 4-mirror systems for microlithography are known from US 2003/0147130, US 2003/0147149, U.S. Pat. Nos. 6,213,610, 6,600,552 or 6,302,548. Systems of this kind are provided with a diaphragm arranged in the optical path from an object plane to an image plane in front of the first mirror of the projection system, a so-called 'front stop'. A front stop has the disadvantage that it results in either a system with a large overall construction length or a large chief ray angle at the object. A large construction length prevents the construction of a compact and space-saving system and a large chief ray angle at the object generates significant vignette effects when using a reflective mask because the thickness of the absorbent structure mounted on the reflective multiple layers is not negligible.

6-mirror systems for microlithography are known from the publications U.S. Pat. Nos. 6,353,470, 6,255,661, US 2003/0147131 and US 2004/0125353.

In U.S. Pat. No. 6,353,470 the diaphragm lies either on a mirror or between two mirrors, where the distance to a beam of light extending in the vicinity of the diaphragm from one used area of a mirror to a used area of a subsequent mirror in the optical path is <5% of the construction length of the projection system. The construction length or the structural length of a projection system is defined in this application as the axial distance measured along the optical axis (HA) of the projection system from the object plane to the image plane. For a conventional construction length of 1000 mm to 1500 mm for such a system, the radial distance between the aperture stop and a passing beam of light amounts to less than 50 mm or 75 mm, respectively. Within the scope of this application, the radial distance of a used area or an aperture stop from a beam of light is defined as the perpendicular distance with respect to the optical axis from a beam of light which is closest to the boundary of the used area or the aperture stop as shown in FIG. 4b. U.S. Pat. No. 6,255,661 discloses the provision of an aperture stop between the second and third mirror. However, in this case the radial distance to a beam of light extending in the vicinity of the aperture stop from one used area of a mirror to a second used area of a subsequent mirror positioned in the optical path amounts to less than 5% of the construction length of the projection system.

In the case of the 6-mirror system disclosed in US 2003/0147131, the aperture stop lies on the second mirror or between the first and the second mirror. With an arrangement between the first and the second mirror, the radial distance of the aperture stop to the optical path from the object to the first mirror and to the optical path from the second to the third mirror is less than 5% of the construction length of the projection lens.

U.S. Pat. No. 6,781,671 discloses a 6-mirror system that has a aperture stop arranged between the second and third mirror. The radial distance of the aperture stop to the optical path from the first to the second mirror is less than 11% and the radial distance of the aperture stop to the optical path from the third to the fourth mirror less than 32% of the construction length. The chief ray angle at the diaphragm is greater than 26°. In the present application the chief ray angle at the diaphragm or aperture stop is defined as the angle at which the chief ray of the central field point passes through the diaphragm plane in which the diaphragm or aperture stop is arranged.

U.S. Pat. No. 6,781,671 discloses an 8-mirror system that has a aperture stop arranged between the second and third mirror. The radial distance of the aperture stop to the optical path that extends from the first to the second mirror, amounts to less than 12%, and the distance of the aperture stop to the optical path from the third to the fourth mirror is less than 16%. The chief ray angle at the aperture stop is greater than 24°.

Further 8-mirror systems for microlithography are known from US 2002/0129328 or U.S. Pat. No. 6,556,648. In these systems the aperture stops are always positioned on a mirror.

U.S. Pat. No. 5,686,728 shows an 8-mirror system having an aperture stop between the second mirror and the third mirror, but the radial distance of the aperture stop in this system to the optical path of a beam of light extending in the vicinity of the aperture stop, is less than 1% of the construction length of the projection system.

Systems, as described above, in which the aperture stop lies on or near a mirror, have the disadvantage that an adjustable aperture stop design can only be technically implemented at a certain minimum distance of the diaphragm in front of a mirror. Consequently, the light passes through an aperture stop arranged in the optical path in this manner twice: once directly in front of the mirror and once directly after the mirror. This results in vignetting by the diaphragm that becomes apparent for instance in H-V differences. In order to prevent this vignetting, a single-pass diaphragm or aperture stop is advantageous from an optical standpoint, in particular with high aperture systems.

A single-pass aperture stop for an 8-mirror system is shown in U.S. Pat. No. 5,686,728. The aperture stop in U.S. Pat. No. 5,686,728 is arranged between the second mirror and the third mirror in the front section of the system. The disadvantage of this embodiment is, however, the large chief ray angle at the diaphragm, which is approximately 34° for an image-side NA of 0.5. The large chief ray angle at the aperture stop in U.S. Pat. No. 5,686,728 is attributable to the minimal axial distance between the second mirror and the third mirror. In order to ensure an obscuration-free optical path in the case of U.S. Pat. No. 5,686,728, it is necessary to physically split the beam of light at the aperture stop from the first mirror to the second mirror, from the second mirror to the third mirror and from the third mirror to the fourth mirror. In order to achieve this, the projection system has a large chief ray angle at the aperture stop as this results in a smaller aperture diameter, owing to the fact that the product of the chief ray angle and the diameter of the beam of light is a constant. However, a large chief ray angle at the aperture stop has disadvantages. For instance, a large chief ray angle causes a large telecentric error when the diaphragm is displaced along an x, y or z axis. A further disadvantage is that a large chief ray angle means the diameter of the aperture stop is small. This has technical manufacturing disadvantages as requirements with respect to the precision of shaping measured in absolute units are very stringent for aperture stops or diaphragms with a small diameter. In contrast, a small chief ray angle means a large aperture diameter and less stringent requirements with respect to precision of shaping or mould precision.

SUMMARY OF THE INVENTION

The disadvantage of all known systems involving a aperture stop or diaphragm arranged between two mirrors is that there is insufficient space for installing e.g. an iris stop as the distance to the beam of light extending in the proximity of the aperture stop or diaphragm is too small.

One aspect of the invention is to disclose a microlithography projection system without the above-mentioned disadvantages.

In a further aspect of the invention a microlithography projection system is disclosed that provides an location e.g. an diaphragm plane for the installation of an easily accessible diaphragm e.g. the installation of an iris stop.

In this application a diaphragm describes an element with which a light bundle that passes through a diaphragm plane can be influenced. Such an element can be e.g. an aperture stop, especially an iris stop or a grey filter, which modulates light.

Since in this application the diaphragm plane is a plane which is situated in or near a conjugated plane to the exit pupil plane of the projection system in general by the diaphragm the pupil-image in the exit pupil can be influenced.

In even a further aspect of the invention a projection system is disclosed that allows a broad tolerance with respect to diaphragm position and precision of shaping of a diaphragm.

In a further aspect of the invention a microlithography projection system should be provided which allows for the correction of the pupil-image, e.g. the correction of telecentricity and the distortion in the exit pupil plane.

In a first embodiment of the invention for solving at least one of the above mentioned aspects a microlithography projection system especially for wavelengths ≤248 nm, preferably ≤193 nm, in particular EUV lithography for wavelengths ranging from 1-30 nm, for imaging an object field in an object plane onto an image field in an image plane is provided, wherein the microlithography projection system comprising at least three mirrors (S1, S2, S3) with a used area (N1, N2, N3), wherein rays of a light beam that pass through the projection system from the object plane to the image plane in an optical path impinge upon at least one of each of the used areas (N1, N2, N3), and wherein a diaphragm (B) is arranged in a diaphragm plane (1000), wherein a first section of the optical path between a first used area (N1) and a second used area (N2) passes the diaphragm plane and wherein said diaphragm plane (1000) is only further passed by a second section of the optical path between a second used area (N2) and a third used area (N3) above or below the first section of the optical path. Such an embodiment allows for a diaphragm or aperture stop to be provided in the diaphragm plane which is easily accessible at least from one side.

In a further embodiment of the invention one of the above mentioned aspects is solved by means of a microlithography projection system especially for wavelengths ≤248 nm, preferably ≤193 nm, in particular for EUV lithography for the preferred wavelengths ranging from 1-30 nm, for projecting an object field in an object plane onto an image field in an image plane, with the microlithography projection system comprising at least three mirrors, with the rays of a beam of light passing through the projection system from the object plane to the image plane to impinge upon a used or a a useful area of each of the said mirrors, with a diaphragm or aperture stop arranged at a location or position in a diaphragm plane in a first section of the optical path from a first used area to a second used area, with the position of the diaphragm being determined by a location at which the chief ray of the central field point passes through the diaphragm plane, with the location of the diaphragm being at a radial distance from a second section of the optical path extending from the second used area to a third used area that is greater than 32% of the construction length of the lens, where the construction length of the lens is defined as the distance from the object plane to the image plane along an optical axis of the projection system. This embodiment also allows for an accessible diaphragm.

In the above mentioned embodiments the second used area is arranged after the first used area in the optical path from the object plane to the image plane.

An alternative embodiment fulfils one of the above mentioned aspects by means of a microlithography projection lens or microlithography projection system especially for wavelengths ≤248 nm, preferably ≤193 nm, in particular for EUV lithography for the preferred wavelengths ranging from 1-30 nm, for imaging an object field in an object plane onto an image field in an image plane, with the microlithography projection system comprising at least four mirrors, with the rays of a beam of light passing through the system from the object plane to the image plane to impinge upon a used area of each of the said mirrors, wherein a diaphragm or aperture stop is provided at a position in a diaphragm plane in a second segment of the optical path from a second used area to a third used area, with the location of the diaphragm being at a first radial distance from a first section of the optical path extending from a first used area to a second used area that is greater than 12% of the construction length of the projection system and a second radial distance from a third section of the optical path extending from the third used area to a fourth used area that is greater than 16% of the construction length of the projection system, where the construction length of the projection system is defined as the distance from the object field to be imaged to the image field along the optical axis of the projection system. This embodiment allows for an accessible diaphragm from two sides of the diaphragm or aperture stop.

In the present application the useful or used area is defined as the area on a mirror surface impinged upon by the rays of the beam of light of the effective wavelength passing through the projection lens from the object plane to the image plane. The effective wavelength is the wavelength $\lambda$ used to image an object in the object plane onto the image plane. For instance, an effective wavelength in EUV lithography is $\lambda=13.5$ nm. Also other effective wavelengths can be used, e.g. $\lambda=248$ nm or $\lambda=193$ nm or $\lambda=157$ nm for UV-lithography. As a light source for EUV-lithography preferably a laser plasma sources is used. For UV-lithography preferably lasers are used as light sources.

In the present invention in a preferred embodiment all optical elements, e.g. mirrors of the projection system are arranged physically, i.e. along the optical axis between the object plane and the image plane.

A radial distance to a beam of light traveling in the vicinity of the diaphragm in accordance with the embodiments described above allows in a preferred embodiment that the diaphragm is to be an iris stop, when there is sufficient space available for an iris stop construction in the above embodiments. The advantage of iris diaphragms or iris aperture stops over interchangeable diaphragms is that the aperture can be altered far easier as no diaphragm components need to be exchanged by means of a retooling device, with the leaves of the iris diaphragm simply requiring actuation.

In one particularly preferred embodiment of the invention the position or location of the diaphragm is selected such that apart from the beam passing through the diaphragm no beam of light runs within the projection system above and/or below the diaphragm. This means that the diaphragm is freely accessible from both sides in a diaphragm plane. in the present application a radial direction is defined as a direction perpendicular to the direction of the principal axis HA of the projection system. A direction in direction of the principal axis HA of the projection system is called a axial direction. A radial distance is a distance along the radial direction and a axial distance a distance along the axial direction. Preferably, systems with an accessible diaphragm from both sides in a diaphragm plane comprise a first group of mirrors and a second group of mirrors, with the first group of mirrors and the second group of mirrors arranged in such a physically separated manner that only a single beam of light from an object plane to an image plane of the projection lens or projection system is formed from the first group of mirrors to the second group of mirrors. In the present application physically separated means that there is an axial gap along an optical axis HA of the projection lens or projection system between the mirrors of the first group of mirrors and the mirrors of the second group of mirrors. In the present application the gap between two mirrors is defined as the axial separation of the vertices of two mirror surfaces along the optical axis.

In a further embodiment of the invention the axial distance between the iris diaphragm and the mirrors arranged physically in front of the iris diaphragm and physically after the iris diaphragm is so large that the iris diaphragm can also be displaced axially, i.e. along the optical axis of the projection system. Displacing the diaphragm along the optical axis allows the telecentric error resulting from diaphragm curvature during opening and closing to be corrected.

Preferably, in order to permit such displacement, the physical distance along the optical axis of the projection system from one mirror in the first group of mirrors SG1, with said mirror having the shortest axial distance to the image plane, to one mirror in the second group of mirrors SG2, with said mirror having the greatest axial distance to the image plane, is greater than 0.1%, and preferably greater than 1%, most preferably greater than 5%, most preferably greater than 10% of the construction length of the system. This axial distance is the physical axial distance between the first and the second group of mirrors. A diaphragm is arranged between the first and second group of mirrors.

In one particularly preferred embodiment of the invention, provision is made for the physical axial distance between the first mirror with the first used area and the second mirror with the second used area, between which the diaphragm is arranged, to be greater than 40% of the structural length or construction length of the projection system, preferably greater than 60% of the structural length of the projection system, most preferably greater than 80% of the structural length of the projection system. This has the further advantage that not only can the diaphragm be displaced along the axis, but the chief ray angle at the diaphragm is also small.

Preferably, the chief ray angle at the diaphragm is less than 24°, preferably less than 22°, and highly preferred is less than 20°, most preferably less than 18°, especially preferred less than 16° and in particular less than 14°.

In order to provide a microlithography projection system that allows a broad tolerance with respect to diaphragm position and precision of shaping of a diaphragm and a high image side numerical aperture a microlithography projection system comprises at least two mirrors with an aperture stop arranged in the optical path between the two mirrors and in a light path from one of the two mirrors to the other of the two mirrors. Furthermore no further optical element beside the aperture stop is situated the optical path from the one of the two mirrors to the other of the two mirrors and a chief ray passes through the aperture stop at an aperture angle <14° with respect to an optical axis (HA) of the projection system. Preferably the image-side numerical aperture (NA) of this system is greater or equal to 0.3, preferably greater or equal to 0.35, most preferably greater or equal to 0.4.

In a further embodiment of the invention in a microlithography projection system comprises at least two mirrors, wherein an aperture stop or diaphragm is arranged in the optical path between the two mirrors and in a light path from one of the two mirrors to the other of the two mirrors no further optical element is situated and the ratio between the aperture angle measured in degrees of the chief ray and the image side numerical aperture NA is smaller or equal to 50, especially smaller or equal to 40, most preferably smaller or equal to 30.

If the aperture angle, e.g. at the diaphragm is 14° and the image side numerical aperture is NA=0.26 then the ratio of the aperture angle to the image side numerical aperture NA is 14/0.3=46.6.

In a further embodiment of the invention the projection-lens is developed in such a manner that the chief ray angle at which the beam of light impinges on the mirror adjacent to the diaphragm is also less than 24°, preferably less than 20°, and highly preferred less than 18°. The chief ray angle at which the beam of light impinges on the mirror is defined as the angle at which the chief ray, corresponding to the central field point, impinges upon the used or area with respect to the surface normal.

The microlithography projection system in accordance with the invention can be provided with two three, four, five, six, seven, eight or more used areas and/or mirrors. The diaphragm or aperture stop can be arranged between each of the used areas. Arranging the diaphragm between two used areas has the advantage that in comparison to embodiments with so-called front stops, the structural length or construction length and/or the chief ray angle at the illuminated object can be kept minimal.

If no mirror surface is employed twice, the number of used areas corresponds to the number of mirrors.

In a preferred embodiment of the invention a large numerical aperture (NA) at the image is achieved, preferably greater or equal to 0.3, preferably greater or equal to 0.35, most preferably greater or equal to 0.4 with a very small chief ray angle at the diaphragm.

Preferably, the microlithography projection system provides for at least one intermediate image.

In a further embodiment, the microlithography projection system comprises at least two intermediate images.

Intermediate images maintain the small diameter of the beam of light passing through the projection system from the object plane to the image plane, thus also ensuring small mirrors, which are simpler to manufacture as for instance there is no necessity for large and expensive coating chambers.

In order to allow for the correction of the pupil-image, e.g. the correction of telecentricity and the distortion in a pupil plane of a microlithography projection system for imaging an object field in an object plane onto an image field in an image plane with a wavelength $\lambda$ is provided, wherein the microlithography projection system is a catoptric projection system comprising
at least one intermediate image of the object and an aperture stop in the optical path of a beam of light from the object plane to the image plane. In such a projection system diaphragm or aperture stop in the optical path is arranged or situated behind the at least one intermediate image, i.e. the aperture stop is located optically between the at least one intermediate image and the image plane. This allows for the arrangement of optical elements such as mirrors in the optical path of a light beam from the object plane to the image plane before the aperture stop, i.e. optically between the object plane and the aperture stop in order to set the chief ray angle at the object optimally. Furthermore there can be sufficient optical elements provided in the light path behind the aperture stop, i.e. between the aperture stop and the image plane, to fulfill e.g. the telecentricity specification on the image plane.

Preferably in such a microlithography projection system the aperture stop is arranged at a large axial distance from a used area. The axial distance between the aperture stop and the used area is preferably greater or equal to 0.1%, preferable greater or equal to 1%, most preferable greater or equal to 5%, most preferred greater or equal to 10% of the construction length of the projection system.

In even a further embodiment of the invention with two intermediate images, the microlithography projection system in accordance with the invention is a 8-mirror microlithography projection system comprising three subsystems, with the first subsystem projecting the object field onto a first intermediate image of the object field, the second subsystem projecting the first intermediate image of the object field onto a second intermediate image of the object field and the third subsystem projecting the second intermediate image of the object field onto the image field.

Preferably, provision is made in a system with a least an intermediate image for the diaphragm to be in the beam of light propagating from the object plane to the image plane after or behind the at least one intermediate image. If the system comprises two intermediate images, then the aperture stop or diaphragm is situated after the first intermediate image and in front of the second intermediate image. Consequently, in optical terms the aperture stop is arranged in the center of the projection system. This means that there are sufficient means of correction, i.e. mirrors with segments or used areas in the section of the projection system or lens in front of the aperture stop, such that the chief ray angle at the object can be set optimally, and also that there are sufficient means of correction in the section of the projection system behind the aperture stop to fulfill the telecentricity specification on the image plane.

The chief ray angle at the object is the angle at which the chief ray of the central field point impinges on the object on the object plane with respect to the normal.

if the projection system comprises three subsystems, preferably, the third subsystem comprises at least two used areas.

In one further developed embodiment the first subsystem comprises at least two used areas.

In one particularly preferred embodiment the second subsystem comprises at least two used areas.

In an preferred embodiment of the microlithography projection system as an 8-mirror projection system with preferably two intermediate images, the diaphragm is arranged between the fourth and fifth used area.

In a particularly preferred embodiment, the chief rays CR emanating from each point of the object enter the entrance pupil of the microlithography projection system divergently with respect to the principal axis (HA) of the system. For systems involving the chief rays entering the entrance pupil divergently with respect to the optical axis, the entrance pupil of the lens lies in the optical path of a projection exposure system with a projection system having a reflective object situated in an object plane in front of the object plane of the projection lens such as described in PCT/EP2003/000485.

The entrance pupil of a lens or projection system is defined in this application as an image of the aperture stop imaged by the system part that lies optically between the object and the aperture stop.

In one particularly preferred embodiment provision is made for a mirror and/or a mirror surface to be employed twice. This means that a mirror and/or a mirror surface is provided with two used areas. By using a mirror surface in the optical path from the object to the image twice, it is possible to reduce the number of mirrors e.g. from eight to seven or six mirrors.

Preferably the microlithography projection systems described before are catoptric microlithography projection systems. Catoptric microlithography projection system have as optical elements only reflective optical elements such as mirrors for imaging an object in an object plane into an image in an image plane.

In even a further embodiment the microlithography projection system is a catadioptric projection system. Catadioptric microlithography projection systems comprise reflective optical elements as well as refractive optical elements for imaging an object in an object plane into an image in an image plane. For a man skilled in the art combinations of all preferred embodiments amongst each other are possible without leaving the scope of the invention.

In addition to the microlithography projection system, the invention also provides a projection exposure system. The projection exposure system comprises a light source to generate electromagnetic radiation, an illumination unit for partially collecting the radiation emitted from the light source and for transmitting it to illuminate an annular field, a structure-bearing mask on a substrate system, with this mask lying in the plane of the annular field, and also a projection system in accordance with the invention for projecting the illuminated part of the structured mask onto an image field. A photosensitive substrate can be arranged on a substrate system.

Preferably the light source can be a EUV light source emitting EUV radiation with a wavelength ranging from 1-30 nm.

In addition to the microlithography projection system, the invention also provides a method for manufacturing microelectronic components, in particular chips, using a projection exposure system comprising a lens of this kind. The method involves electromagnetic radiation, i.e. EUV radiation with wavelengths ranging from 1-30 nm emitted by a light source, illuminating via an illumination unit an annular field in a plane. A structured mask is arranged on a substrate system in the plane. Employing the projection system in accordance with the invention, the illuminated section of the mask is imaged onto an image field. A photosensitive substrate that constitutes part of a microelectronic component can be arranged on a substrate system. A microelectronic component, in particular a chip, can be produced as a result of multiple imaging steps involving the photosensitive substrate and development stages. This is known to those skilled in the art.

DESCRIPTION OF THE EMBODIMENTS

The invention will be described in greater detail below with the aid of the examples of embodiments and figures:

FIG. 1: shows the definition of the useful or used area of a mirror

Figure 2:
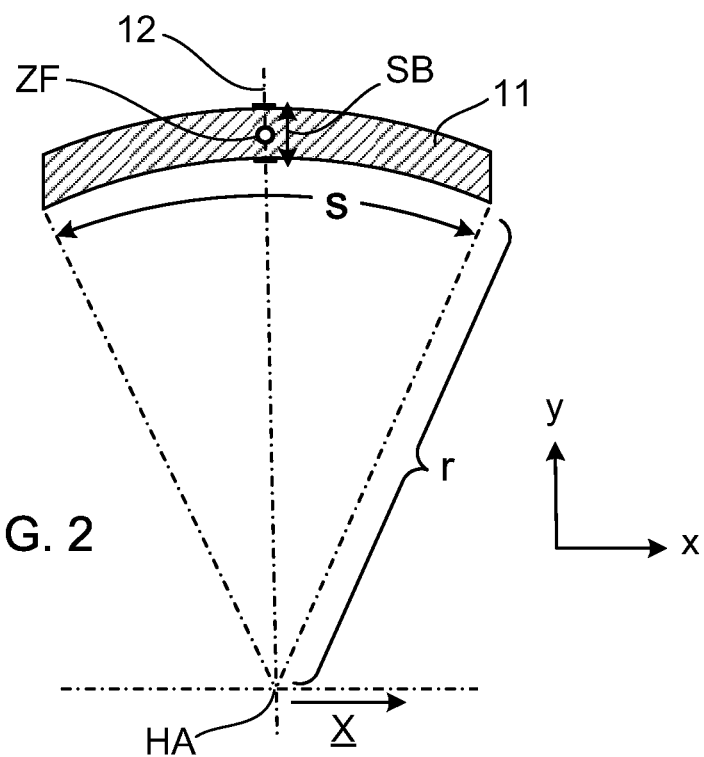
Figure 3:
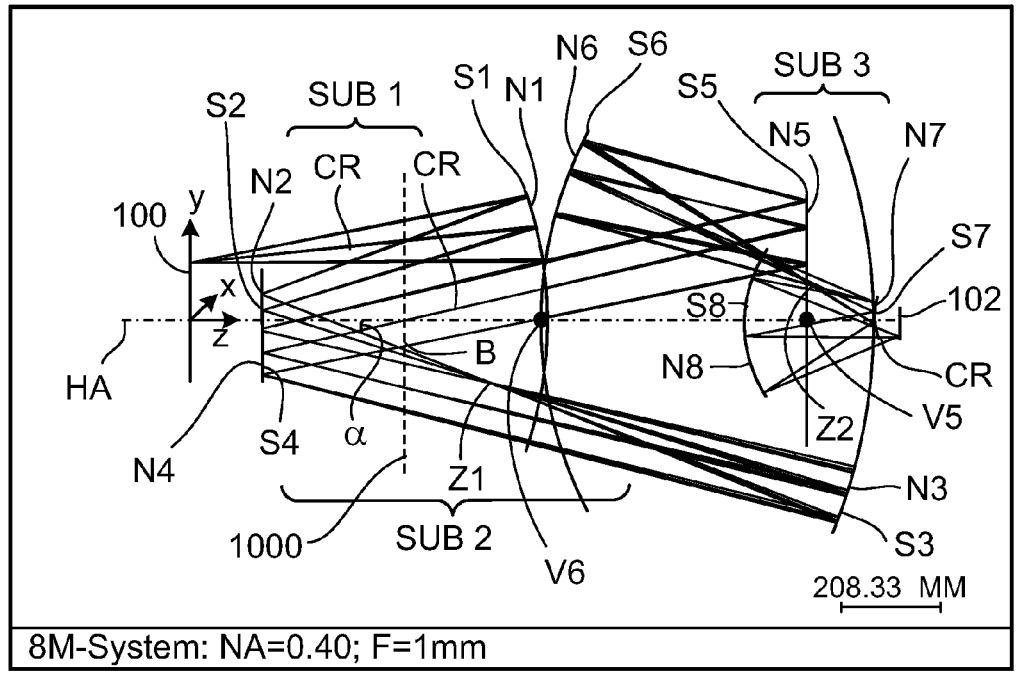
Figure 4A:
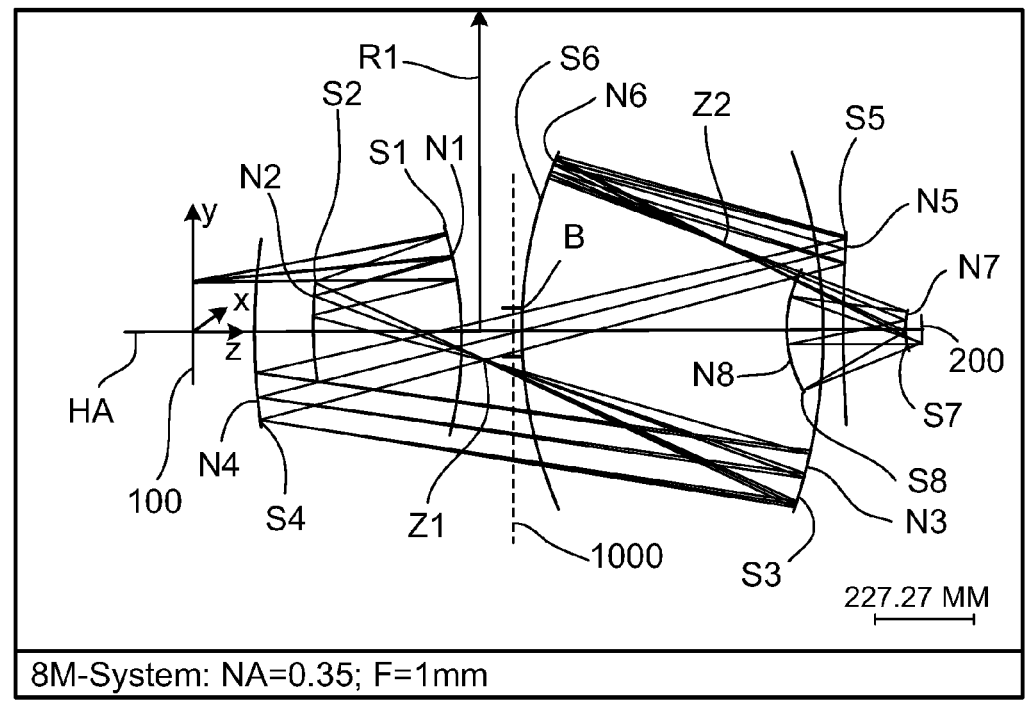
Figure 4B:
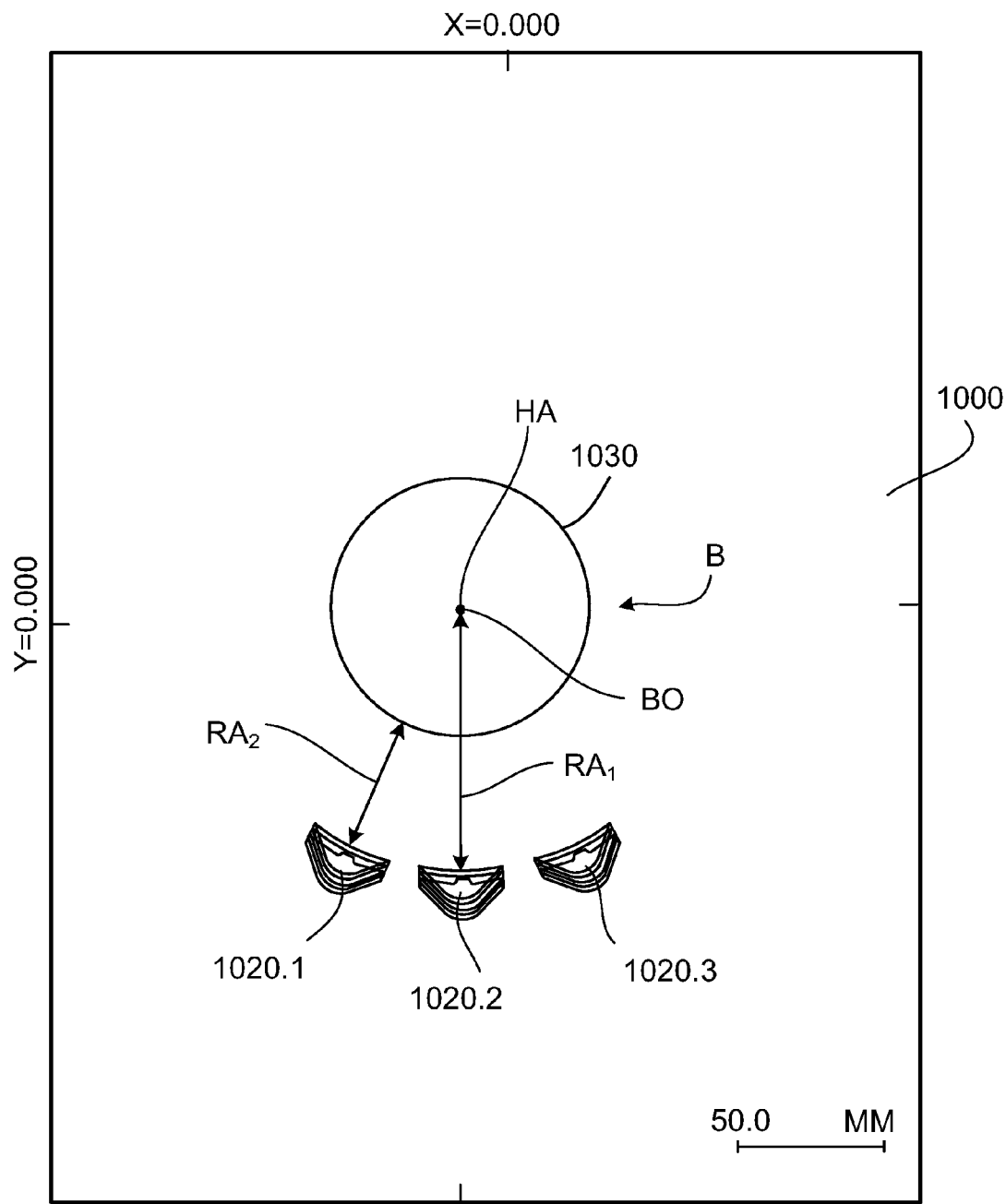
Figure 4C:
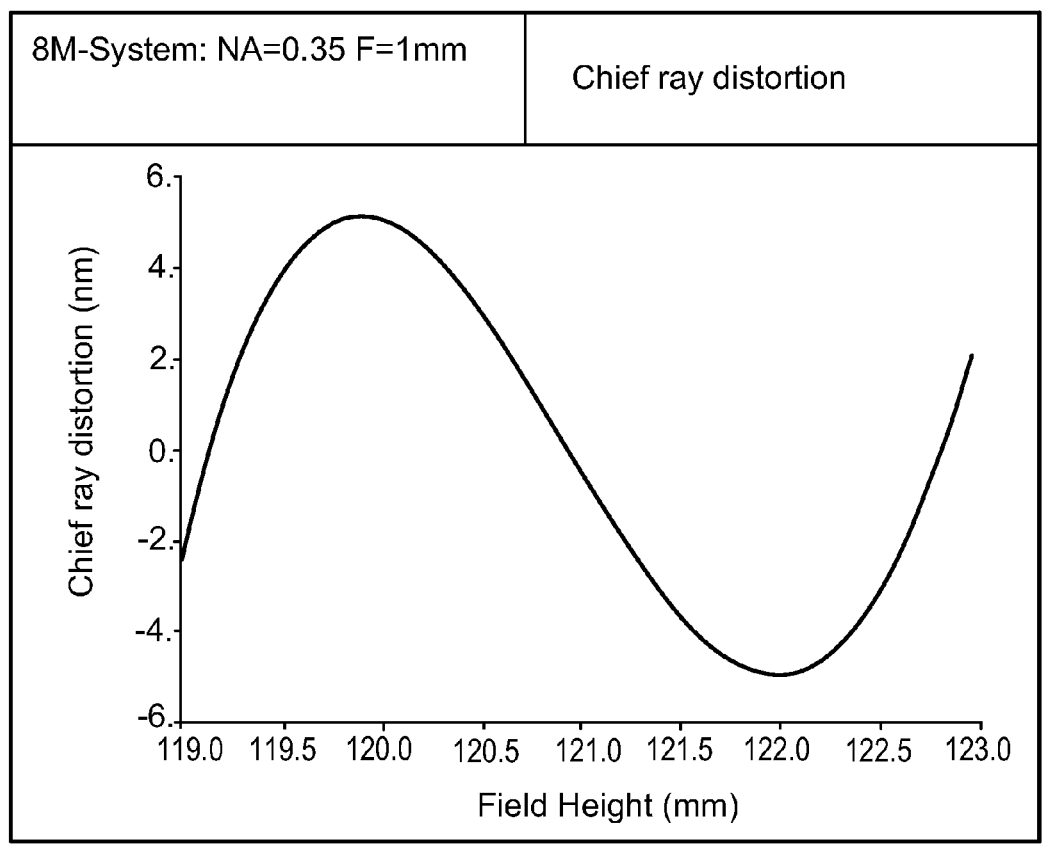

FIG. 2: shows the shape of the field in the object and/or image plane of the lens FIG. 3: shows a first embodiment of a projection system in accordance with the invention FIG. 4*a-c*: show a second embodiment of a projection system in accordance with the invention with eight used areas, where FIG. 4*b* provides the footprint of the beam of light in the diaphragm plane and FIG. 4*c* the distortion along the field height in scanning direction in the object plane.

Figure 5A:
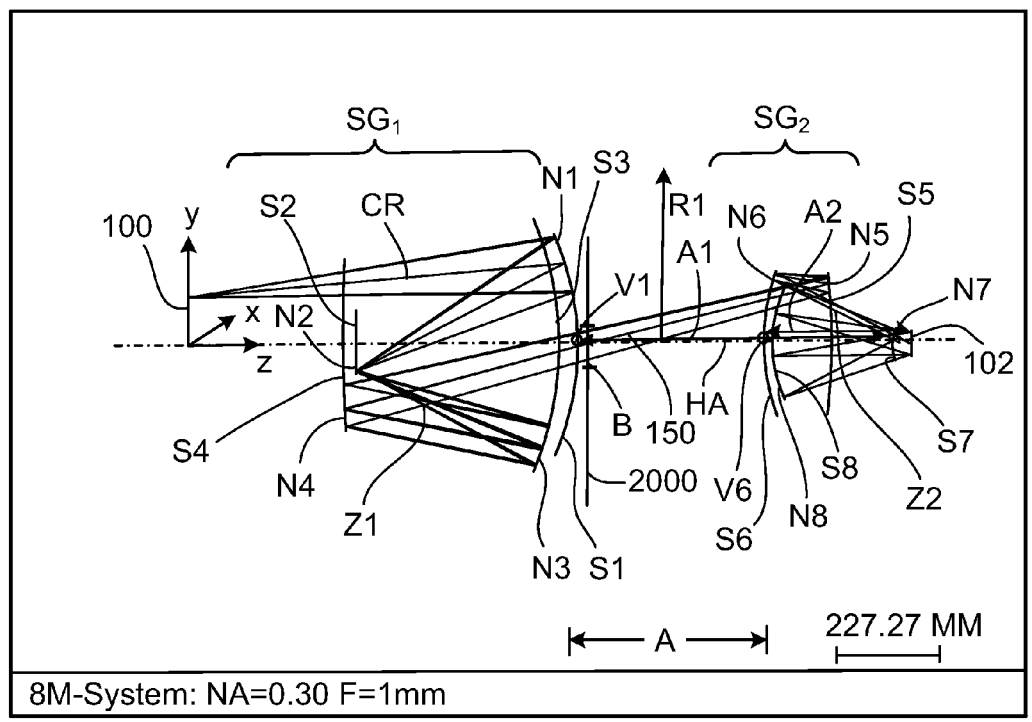
Figure 5B:
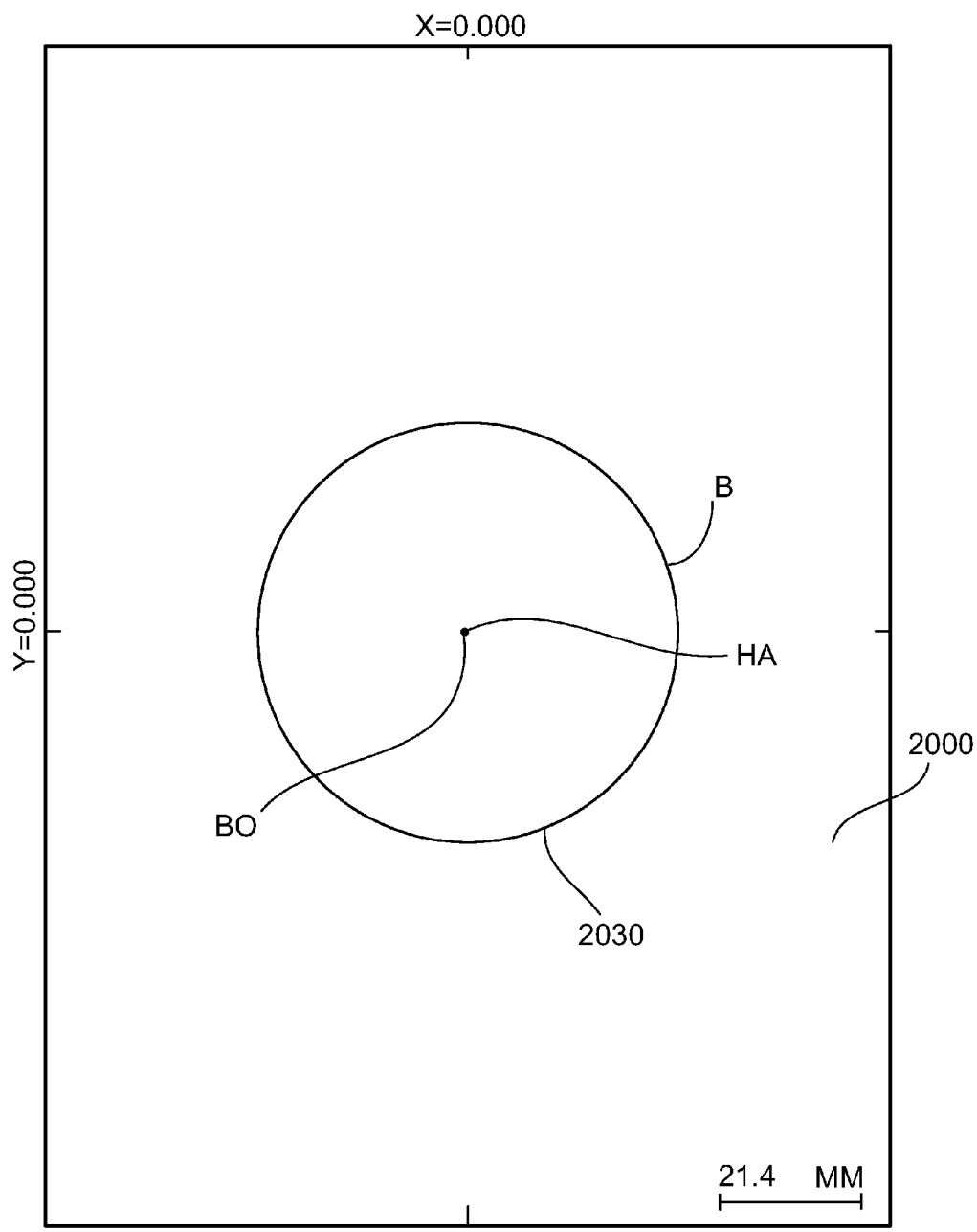
Figure 5C:
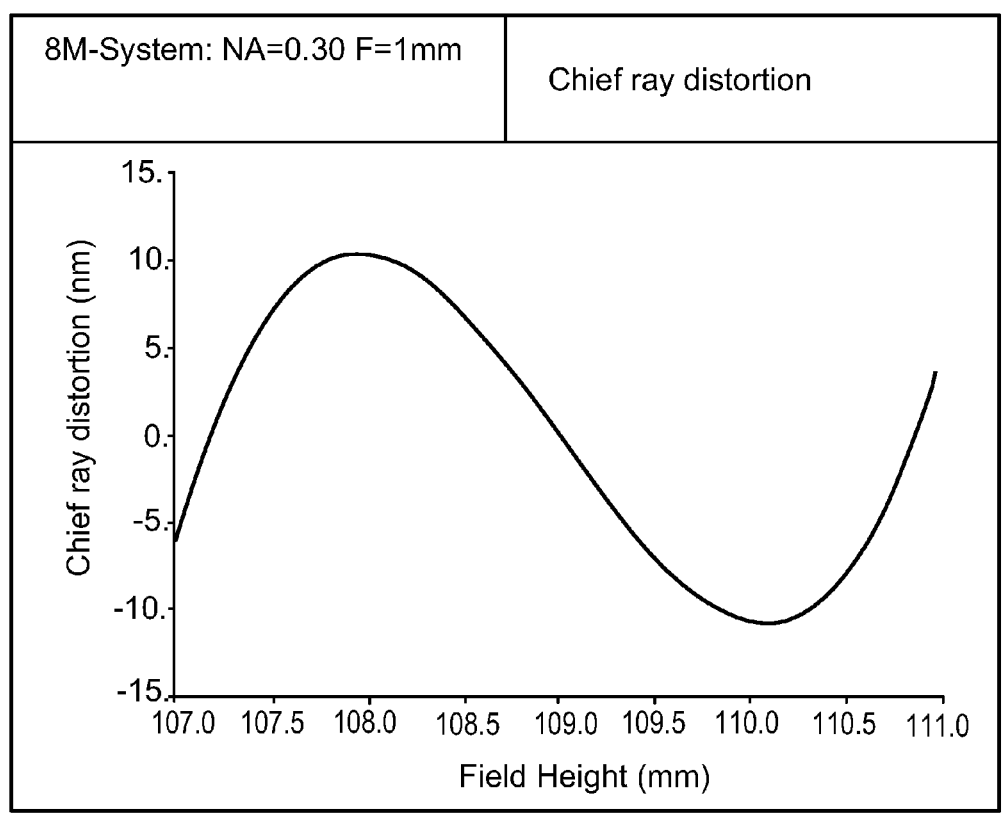

FIG. 5*a-c*: shows a third embodiment of a projection system in accordance with the invention having eight used areas and eight mirror surfaces, and also a diaphragm that is freely accessible from two sides in the y-z section, with FIG. 5*b* providing the footprint of the beam of light in the diaphragm plane. FIG. 5*c* shows the distortion along the field height in scanning direction in the object plane.

Figure 6:
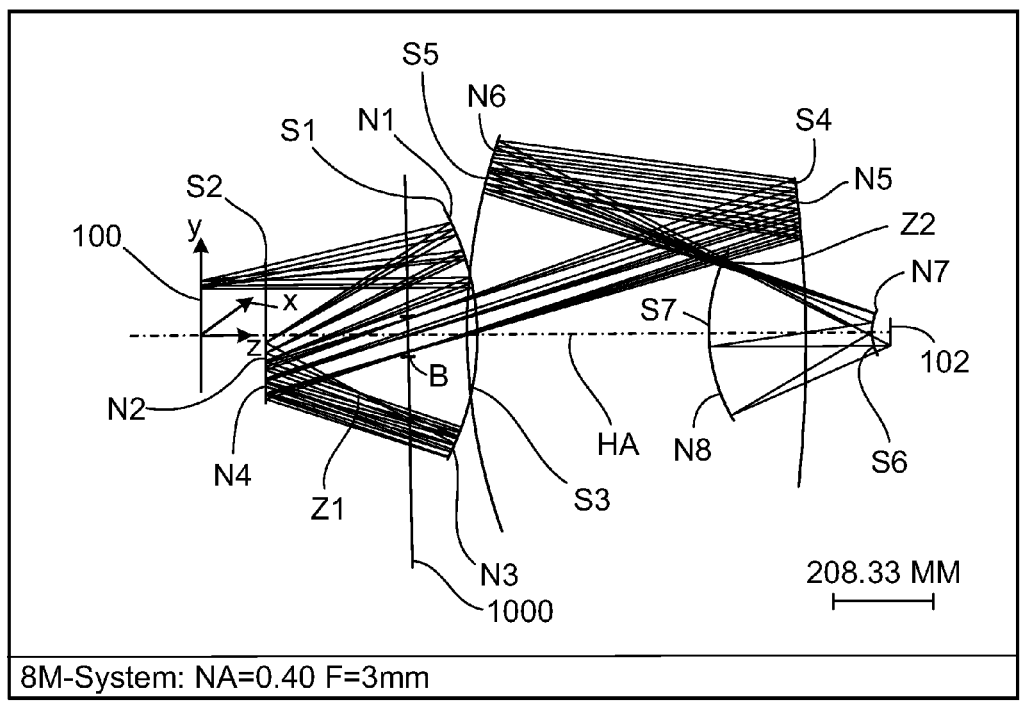
Figure 7:
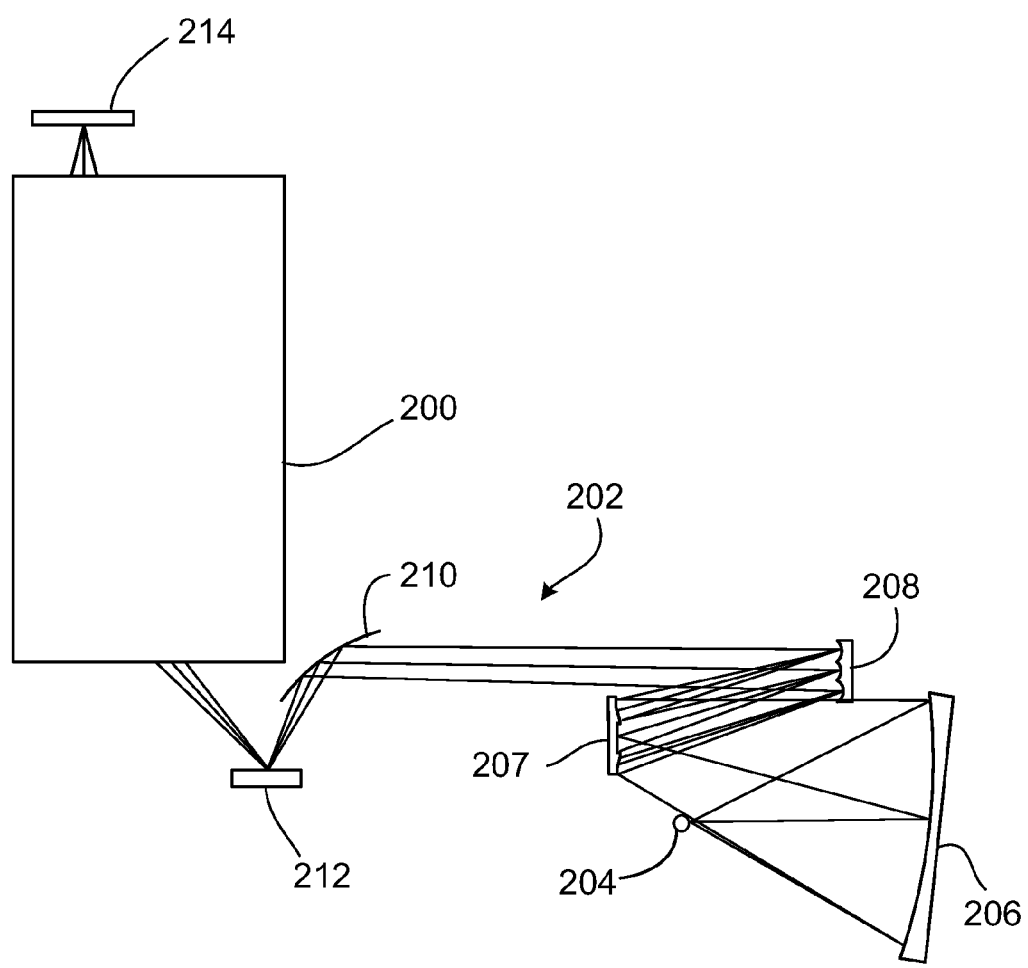

FIG. 6: shows a fourth embodiment of a projection system in accordance with the invention, having eight used areas and eight mirror surfaces and also a diaphragm that is freely accessible from all sides FIG. 7: shows the basic construction design of a projection exposure system with this type of microlithography projection system FIG. 1 shows the useful or used area and the diameter of the useful or used area as defined in the present application.

FIG. 1 shows a kidney-shaped field as an example of an illuminated field 1 on a mirror of the projection lens or projection system. A shape of this kind is expected for the used area when a lens in accordance with the invention is employed in a microlithography projection exposure system. The enveloping circle 2 totally encompasses the kidney-shaped field and coincides with the boundary 10 at two points 6, 8. The enveloping circle is always the smallest circle which encompasses the used area. Consequently, the diameter D of the used area is a function of the diameter of the enveloping circle 2.

FIG. 2 shows an example of the object field 11 of a EUV projection exposure system in the object plane of the microlithography projection system, imaged with the aid of the projection lens or projection system in accordance with the invention on a image plane, in which a photosensitive object, for instance a wafer, is arranged. The shape of the image field corresponds to that of the object field. Reduction lenses or reduction projection systems such as those used in microlithography reduce the image field by a specified factor, e.g. by a factor of 4, preferably a factor of 5, most preferably a factor of 6, even most preferably a factor of 7, especially preferably a factor of 8 in comparison to the object field. For an EUV lithographic system, the object field 11 has the shape of a segment of an annular field.

The segment has an axis of symmetry 12. Furthermore, FIG. 2 shows the central field point ZF of the annular field segment 11. In FIG. 2 SB designates the width of the field in scan orientation, also referred to as the scan slit width, s refers to the arc length and r the radius, i.e. the radial distance to the principal axis (HA).

In catoptric systems only reflective optical components such as mirrors are used. In case of catoptric systems the preferred field in the image plane is a annular field.

Catadioptric systems also contain transparent components in addition to reflective optical components. Catadioptric systems are also an aspect of the present invention, in case of catadioptric systems the preferred field in the object plane is a rectangular field.

Furthermore, FIG. 2 indicates the axes spanning the object and/or image plane, namely the x axis and the y axis. As shown in FIG. 2, the axis of symmetry 12 of the annular field 11 extends in the direction of the y axis. At the same time the y axis coincides with the scan orientation of an EUV projection exposure system, designed as an annular field scanner. The x axis is thus the orientation perpendicular to scan orientation within the object plane. FIG. 2 also shows the unit vector x in the direction of the x axis.

The optical axis HA of the system extends along the z axis. Although a projection system with eight used areas is described below as an example, the invention is not restricted to such a system. Microlithography projection systems having three, four, five, six, seven, eight and more used areas being encompassed by the invention, where a diaphragm is arranged at a position in a first section of the optical path from a first used area to a second used area, with the distance from the diaphragm position to a second section of the optical path between a second used area and a third used area being greater than 32% of the construction length of the projection system or projection lens. The construction length is defined as the axial distance from the object field to be imaged to the image field along the optical axis HA.

A further embodiment of the application describes projection lenses or projection systems comprising at least four mirrors, with the rays of a beam of light passing through the lens from the object plane to the image plane impinge upon a used area of each of the said mirrors, with provision being made for a diaphragm at a position in a diaphragm plane in a second section of the optical path from a second used area to a third used area, with the location of the diaphragm or aperture stop being at a first distance from a first section of the optical path extending from a first used area to a second used area that is greater than 12% of the construction length of the lens or projection system, and the location of the diaphragm being at a second distance from a third section of the optical path extending from the third used area to a fourth used area that is greater than 16% of the construction length of the projection system, where the construction length of the projection system is defined as the distance from the object field to be imaged to the image field along the optical axis.

FIG. 3 shows a first example of an embodiment of a catoptric projection system that can be used e.g. in EUV-lithography with wavelengths λ<30 nm and that features a very small chief ray angle of just 14° at the diaphragm B at an aperture of NA=0.40.

The projection system projects or images an object in an object plane 100 onto an image plane 102, on which for instance a wafer can be arranged.

FIG. 3 shows the local coordinate system in the object plane 100, in which a mask or so called reticle is arranged in a projection exposure system. The origin of the coordinate system lies on the optical axis HA. The principal axis (HA) of the projection lens extends along the z axis. The y axis designates the scan orientation as defined in FIG. 2. The projection lens in accordance with the invention comprises eight used areas N1, N2, N3, N4, N5, N6, N7 and N8.

The first intermediate image Z1 lies in the optical path between a second used area N2 and a third used area N3. The diaphragm B lies in the optical path between a fourth used area N4 and a fifth used area N5. The second intermediate image Z2 lies between the sixth used area N6 and the seventh used area N7. In the embodiment shown, the first subsystem SUB1 comprises the used areas N1 and N2, the second subsystem SUB2 the used areas N3, N4, N5 and N6, and the third subsystem SUB3 the used areas N7 and N8.

The example of the embodiment shown in FIG. 3 comprises eight mirrors S1, S2, S3, S4, S5, S6, S7 and S8 having eight used areas N1, N2, N3, N4, N5, N6, N7 and N8. All eight mirrors S1, S2, S3, S4, S5, S6, S7 and S8 are aspherical mirrors. FIG. 3 also shows the y and z axes of the x, y, z coordinate system. The z axis extends parallel to the optical axis HA and the z axis projects from the object plane 100 to the image plane 102. The y axis extends parallel to the axis of symmetry 12 of the object field 11. The object field 11 is shown in FIG. 2. The y-z-plane shown in FIG. 3 is also denoted as meridional section.

The system is centered with respect to the optical axis HA and is on the image side telecentric in the image plane 102. Image-side telecentricity means that the chief ray CR of the central field point ZF meets the image plane 102 at an angle close to or approximating 0° with respect to the normal, which is perpendicular to the object plane.

The projection system shown in FIG. 3 with eight used areas on eight mirrors and/or mirror surfaces is provided with an image-side aperture NA=0.4 and a scan slit width of 1 mm. To minimize the angle of incidence on the single mirror surfaces, the chief ray angle at object 100 was minimized, with the object-side aperture NAO=0.1. In this manner the angle of incidence is minimized on the first mirror. The maximum chief ray angle at the object is less than 6.5° in the case of the stated object-side numerical aperture NAO of 0.1.

The exact specification of the projection system in accordance with FIG. 3 in Code V format are given in the following Table 1:

TABLE 1

Optical data of Embodiment 1 according to FIG. 3

| Surface | Radius | Thickness | Mode |
|---|---|---|---|
| Object | INFINITY | 751.558 | |
| Mirror 1 | −1072.117 | −601.471 | REFL |
| Mirror 2 | 3903.145 | 1291.928 | REFL |
| Mirror 3 | −1304.976 | −1291.928 | REFL |
| Mirror 4 | 19333.86 | 292.717 | REFL |
| STOP | INFINITY | 860.418 | |
| Mirror 5 | −21484.816 | −660.864 | REFL |
| Mirror 6 | 993.495 | 699.657 | REFL |
| Mirror 7 | 171.261 | −266.912 | REFL |
| Mirror 8 | 325.575 | 324.897 | REFL |
| Image | INFINITY | 0 | |

| Surface | K | A | B | C |
|---|---|---|---|---|
| Mirror 1 | 0.00000E+00 | −2.57399E−10 | −6.47769E−17 | −4.47874E−21 |
| Mirror 2 | 0.00000E+00 | −2.67579E−09 | −8.22615E−14 | 2.10252E−19 |
| Mirror 3 | 0.00000E+00 | 1.00633E−10 | −2.02312E−16 | 3.13442E−22 |
| Mirror 4 | 0.00000E+00 | −5.06446E−09 | 1.65866E−14 | −2.05299E−18 |
| Mirror 5 | 0.00000E+00 | 2.53413E−10 | 8.10816E−16 | −5.92196E−21 |
| Mirror 6 | 0.00000E+00 | 6.37357E−12 | 2.14262E−16 | −7.84631E−22 |
| Mirror 7 | 0.00000E+00 | −5.26794E−08 | 1.28356E−11 | 6.08242E−16 |
| Mirror 8 | 0.00000E+00 | 2.04880E−10 | 2.23993E−15 | 2.00443E−20 |

| Surface | D | E | F | G |
|---|---|---|---|---|
| Mirror 1 | 7.04837E−27 | 7.21766E−32 | 8.49831E−37 | 0.00000E+00 |
| Mirror 2 | 2.23758E−21 | −3.04749E−25 | 2.20843E−29 | 0.00000E+00 |
| Mirror 3 | 1.47063E−28 | −2.10538E−33 | 3.20340E−39 | 0.00000E+00 |
| Mirror 4 | 1.42606E−22 | −2.61704E−27 | 5.14731E−32 | 0.00000E+00 |
| Mirror 5 | 6.32909E−26 | −3.91415E−31 | 3.23288E−37 | 0.00000E+00 |
| Mirror 6 | 3.20130E−27 | −4.60317E−33 | −4.49165E−39 | 0.00000E+00 |

TABLE 1-continued

Optical data of Embodiment 1 according to FIG. 3

| Mirror 7 | 2.08602E−18 | −8.11403E−22 | 1.18473E−25 | 0.00000E+00 |
| Mirror 8 | 2.41505E−25 | −2.74437E−31 | 6.36537E−35 | 0.00000E+00 |

Where:
Object: The position of the object plane
Mirror 1: Mirror S1
Mirror 2: Mirror S2
Mirror 3: Mirror S3
Mirror 4: Mirror S4
Mirror 5: Mirror S5
Mirror 6: Mirror S6
Mirror 7: Mirror S7
Mirror 8: Mirror S8
STOP: aperture stop or diaphragm
Image: Position of the image plane
K conical constant
A, B, C, D, E, F, G aspherical coefficients The upper, first part of Table 1 provides the general optical system data and the lower, second part the conical constant and the aspherical coefficients of each single mirror surface.

Employing the projection system in accordance with the first example of the embodiment, shown in FIG. 3 and table 1, a chief ray angle is achieved at the diaphragm B on the diaphragm plane 1000 that is smaller than 20°, namely just 14°. In the present case, the chief ray angle α at the diaphragm is defined as the angle α at which the chief ray CR of the central field point ZF of the annular field in accordance with FIG. 2 passes through the diaphragm plane 1000. In comparison with state-of-the-art systems, for instance U.S. Pat. No. 6,781,671 B1, the present projection system has the advantage that the chief ray angle at the diaphragm is minimal. With its minimal chief ray angle, the single-pass diaphragm has broader positional tolerances than previously shown state-of-the-art systems.

A further advantage of the system in accordance with the first example of the embodiment is that the sixth mirror S6 is arranged in axial direction in front of the first mirror S1. This makes it is possible to arrange the fifth mirror S5 and sixth mirror S6 at great distances from each other physically, i.e. along the optical axis HA. The distance along the optical axis from the vertex V6 of the sixth mirror S6 to the vertex V5 of the fifth mirror is greater than ⅓ of the construction length of the projection system. In this manner the beam of light strikes the used area of the mirror at a very low angle of incidence.

Arranging the third mirror S3 axially behind the sixth mirror S6 results in a large distance between the second mirror S2 and the third mirror S3. This large distance and/or this large drift interval between S2 and S3 allows the angle of incidence of the beam of light that strikes the useful area of the third mirror to be kept low.

Furthermore, in the example of the embodiment shown in FIG. 3 the optical path from the first intermediate image Z1 to the third mirror S3 is so great that large subapertures develop in the first intermediate image Z1. In the present application a subaperture is defined as the footprint of a single field point on a mirror, i.e. the zone illuminated by a beam of light corresponding to a field point of a field, e.g. of an annular field, on a mirror surface impinged upon by the beam of light. Preferably, the diameter of the subaperture on the mirror is as large as possible, in order to reduce the impact of contamination or defects on the image as much as possible. The diameter of the subaperture is relatively small on a mirror when the intermediate image is in the vicinity of the mirror.

FIGS. 4a-4c show a second embodiment of a projection system in accordance with the invention having eight used areas N1, N2, N3, N4, N5, N6, N7 and N8. FIG. 4 shows a cross-section along the optical axis HA. Each used area corresponds to a mirror S1, S2, S3, S4, S5, S6, S7, S8, i.e. no mirror is utilized twice in the example of the embodiment shown. The same reference numbers apply to the same construction components as in FIG. 3. In particular, the x axis, the y axis and the z axis are defined in the same manner as in the description of FIG. 3.

The projection lens is provided with an image-side NA of 0.35, with a scan slit width of 1 mm. The scan slit width SB in this application designates the extension of the field in accordance with FIG. 2 in scan orientation, i.e. along the y axis. A first intermediate image Z1 is provided in the optical path between the second used area N2 and the third used area N3 and a second intermediate image Z2 between the sixth used area N6 and seventh used area N7. The diaphragm B is arranged in a diaphragm plane 1000 between the fourth used area N4 and the fifth used area N5. The diaphragm plane 1000 is perpendicular to the principal axis HA of the projection system. The diaphragm plane is a x-y plane. As is apparent in FIG. 4a, the diaphragm B is freely accessible, since no beam of light extends in a radial direction R1 above the diaphragm B in the projection system in the z-y plane. Consequently, the diaphragm B is freely accessible from one side, in this case from above. The mean wave front error of this system is less than 0.030 wavelengths. Consequently, image diffraction is restricted and image quality is suitable for lithographic purposes. The distortion of the system is less than 5 nm.

The Code V format data can be found in the following Table 2:

TABLE 2

Optical data of Embodiment 2 according to FIG. 4a-4c

| Surface | Radius | Thickness | Mode |
| --- | --- | --- | --- |
| Object | INFINITY | 620.863 | |
| Mirror 1 | −1104.024 | −340.027 | REFL |
| Mirror 2 | 1841.922 | 1174.431 | REFL |

TABLE 2-continued

Optical data of Embodiment 2 according to FIG. 4a-4c

| | | | |
|---|---|---|---|
| Mirror 3 | −1242.113 | −1305.267 | REFL |
| Mirror 4 | 2422.624 | 597.546 | REFL |
| STOP | INFINITY | 757.012 | |
| Mirror 5 | 7641.802 | −740.045 | REFL |
| Mirror 6 | 992.782 | 878.838 | REFL |
| Mirror 7 | 167.22 | −267.697 | REFL |
| Mirror 8 | 323.336 | 307.697 | REFL |
| Image | INFINITY | 0 | |

| Surface | K | A | B | C |
|---|---|---|---|---|
| Mirror 1 | 0.00000E+00 | −9.05909E−10 | −6.15434E−16 | −2.04482E−20 |
| Mirror 2 | 0.00000E+00 | −3.04349E−09 | 8.19174E−14 | −4.42149E−18 |
| Mirror 3 | 0.00000E+00 | 3.64204E−10 | −1.84948E−15 | 1.90679E−21 |
| Mirror 4 | 0.00000E+00 | −2.04780E−10 | −2.72650E−14 | 3.19448E−19 |
| Mirror 5 | 0.00000E+00 | −8.67238E−10 | 5.08530E−14 | −1.78478E−18 |
| Mirror 6 | 0.00000E+00 | −7.28798E−10 | 4.66025E−15 | −1.31648E−20 |
| Mirror 7 | 0.00000E+00 | 1.73357E−08 | 9.15221E−12 | −5.29307E−16 |
| Mirror 8 | 0.00000E+00 | 2.05157E−10 | 2.33334E−15 | 2.60004E−20 |

| Surface | D | E | F | G |
|---|---|---|---|---|
| Mirror 1 | 2.86683E−24 | −5.62387E−29 | 4.68166E−34 | −8.89962E−40 |
| Mirror 2 | 2.39762E−22 | −8.45133E−27 | 1.66872E−31 | 0.00000E+00 |
| Mirror 3 | 4.53503E−26 | −3.13680E−31 | 8.92194E−37 | −9.90478E−43 |
| Mirror 4 | −2.51097E−24 | 3.88684E−30 | 1.00805E−34 | 2.59035E−39 |
| Mirror 5 | 4.06574E−23 | −5.89266E−28 | 4.86735E−33 | −1.77107E−38 |
| Mirror 6 | −1.81732E−26 | 1.97825E−31 | −3.41090E−37 | 0.00000E+00 |
| Mirror 7 | 7.42366E−19 | −2.77909E−22 | 5.22350E−26 | 0.00000E+00 |
| Mirror 8 | 3.06861E−26 | 9.06962E−30 | −6.55480E−35 | 0.00000E+00 |

Where:
Object: The position of the object plane
Mirror 1: Mirror S1
Mirror 2: Mirror S2
Mirror 3: Mirror S3
Mirror 4: Mirror S4
Mirror 5: Mirror S5
Mirror 6: Mirror S6
Mirror 7: Mirror S7
Mirror 8: Mirror S8
STOP: aperture stop or diaphragm
Image: Position of the image plane
K: conical constant
A, B, C, D, E, F, G aspherical coefficients The upper, first part of Table 2 provides the general optical system data and the lower, second part the conical constant and aspherical coefficients of each mirror surface.

FIG. 4b shows the diaphragm plane 1000 of the projection lens in accordance with FIG. 4. Clearly evident is the boundary 1030 of the diaphragm B, which lies in the diaphragm plane, and also the rays of light 1020.1, 1020.2, 1020.3 extending below the diaphragm B in FIG. 4a from the used area N2 of the second mirror 82 to the third used area N3 of the mirror S3. The sectional area formed by the intersection of the rays 1020.1, 1020.2, 1020.3 of the beam of light traveling from the second to the third used area, with the diaphragm plane 1000, is also known as the "footprint" of the beam of light. The footprint of the beam of light travelling from the used area N3 of the mirror S3 to the used area N4 of the mirror S4 is not shown in FIG. 4b. As shown in FIG. 4b, the radial distance RA1 of the rays of light 1020.2 from the position BO in the center of the diaphragm B is greater than 100 mm. The location 130 of the diaphragm in the present embodiment coincides with the principal axis HA. The radial distance RA2 of the rays of light 1020.1 from the boundary 1030 of the diaphragm B, developed here as a circle, is greater than 50 mm. The radial distance RA2 in the present application is defined as a distance between the beam of light 1020.1 closest to the boundary 1030 of the aperture stop and the actual boundary 1030 of the aperture stop.

FIG. 4c shows the distortion of the chief rays as a function of the field height, i.e. the y-direction or scanning direction of the field shown in FIG. 2. In FIG. 4c the distortion is shown in the object plane. Since the system is a 4× reduction system 4 mm field height in the object plane corresponds to 1 mm field height in the image plane. As apparent from FIG. 4c, the distortion is less than 6 nm.

FIGS. 5a-5c show a highly preferred embodiment of the invention. In the embodiment in accordance with FIGS. 5a-5c the diaphragm B is freely accessible as no beam of light extends in a radial direction R1 above nor below the diaphragm B in the projection system when imaging onto the z-y plane.

FIG. 5a shows the cross-section along the optical axis HA. Free accessibility to the diaphragm is made possible by the special construction of the projection system involving the division into two groups of mirrors. The first group of mirrors SG1 comprises the used areas N1, N2, N3, N4 on the mirrors S1, S2, S3 and S4. The second group of mirrors SG2 comprises the used areas N5, N6, N7 and N8 on the mirrors S5, S6, S7 and S8. The diaphragm B is arranged between the first group of mirrors SG1 and the second group of mirrors SG2. Between first and the second group of mirrors there is only one single optical path 150 from the fourth used area N4 to the fifth used area N5, with said optical path passing through the diaphragm B only once. The diaphragm 13 is arranged in a diaphragm plane 2000 between the mirror S1 in the first group of mirrors SG1, with said mirror located at the shortest distance A1 from the image plane 102, and the mirror S6 in the second group of mirrors SG2, with said mirror located at the greatest geometric-physical distance A2 from the image plane 102.

The geometric-physical distance A1, A2 is defined in the present application as for instance the distance of the vertex of each mirror surface upon which the used area is arranged to the image plane along the optical axis HA of the projection system. Mirror surfaces that are rotationally symmetrical around the optical axis HA are preferred.

As also shown in FIG. 5a, in this embodiment of the invention the groups of mirrors SG1, SG2 are spatially, i.e. physically geometrically, entirely separated from each other, i.e. a physical geometric distance A exists between the group of mirrors as described below.

In order to allow sufficient space for displacement to correct the diaphragm error and telecentricity, in the present embodiment the distance A=A1−A2, i.e. between the vertex V1 of the mirror S1 in the first group of mirrors SG1, with said mirror arranged closest to the image plane 102, and the vertex V6 of the mirror S6 in the second group of mirrors SG2, with said mirror arranged furthest from the image plane 102, constitutes at least 0.1% of the construction length of the projection system, preferably at least 1% of the construction length, more preferably at least 5% of the construction length, most preferably at least 10% of the construction length.

In the case of the example of the embodiment shown in FIGS. 5a-5c, not only is an intermediate image Z1 created in the first group of mirrors SG1, but also an intermediate image Z2 in the second group of mirrors SG2. Consequently, the diaphragm or aperture stop is arranged centrally in the projection system permitting not only the correction of the pupil image from the entrance pupil to the diaphragm plane, but also the pupil image from the diaphragm plane to the exit pupil. This form of correction is also possible in the other aspects of the embodiment shown in this application.

FIG. 5b shows the diaphragm plane 2000 of the projection system in accordance with FIG. 5a. The boundary 2030 of the diaphragm B lying in the diaphragm plane is easily recognizable. FIG. 5b only shows the boundary 2030 of the annular aperture stop, as obviously no beams of light pass through the diaphragm plane from the object-side to the image side, apart from the beam of light passing through the diaphragm plane 2000 as described above.

The 3rd example of the embodiment is provided with an object-side aperture NA=0.30 and a scan slit length of 1 mm. The mean wave front error amounts to less than 0.015 wavelengths and the distortion amounts to less than 10 nm.

The following Table 3 provides the data of the system shown in FIG. 5a-5c in Code V format:

TABLE 3

Optical data of Embodiment 3 according to FIG. 5a-5c

| Surface | Radius | Thickness | Mode |
|---|---|---|---|
| Object | INFINITY | 882.77 | |
| Mirror 1 | −624.736 | −504.089 | REFL |
| Mirror 2 | 581.957 | 458.038 | REFL |
| Mirror 3 | −812.068 | −489.538 | REFL |
| Mirror 4 | 11138.887 | 560.589 | REFL |
| STOP | INFINITY | 550.547 | |
| Mirror 5 | −1447.424 | −148.098 | REFL |
| Mirror 6 | 635.352 | 286.691 | REFL |
| Mirror 7 | 144.805 | −273.394 | REFL |
| Mirror 8 | 319.043 | 313.394 | REFL |
| Image | INFINITY | 0 | |

| Surface | K | A | B | C |
|---|---|---|---|---|
| Mirror 1 | 0.00000E+00 | 7.73915E−10 | −5.98212E−15 | 8.17237E−20 |
| Mirror 2 | 0.00000E+00 | −6.47101E−08 | −9.54735E−12 | 3.78718E−15 |
| Mirror 3 | 0.00000E+00 | −1.54110E−10 | 3.09642E−16 | 2.61579E−20 |
| Mirror 4 | 0.00000E+00 | 7.85369E−10 | −8.14630E−15 | 2.18356E−19 |
| Mirror 5 | 0.00000E+00 | 1.22682E−09 | 3.91275E−14 | −1.29146E−18 |
| Mirror 6 | 0.00000E+00 | 4.19491E−09 | −4.70387E−14 | −1.09647E−19 |
| Mirror 7 | 0.00000E+00 | 2.62448E−08 | 4.35234E−11 | −1.00119E−14 |
| Mirror 8 | 0.00000E+00 | 1.40294E−10 | 1.66083E−15 | 2.07538E−20 |

| Surface | D | E | F | G |
|---|---|---|---|---|
| Mirror 1 | −8.36258E−25 | 5.39973E−30 | −1.58497E−35 | 0.00000E+00 |
| Mirror 2 | −5.40882E−19 | 3.92804E−23 | −1.10963E−27 | 0.00000E+00 |
| Mirror 3 | −3.42501E−25 | 2.39639E−30 | −6.31181E−36 | 0.00000E+00 |
| Mirror 4 | −4.02383E−24 | 4.72289E−29 | −2.59578E−34 | 0.00000E+00 |
| Mirror 5 | 0.00000E+00 | 4.41206E−28 | −5.61328E−33 | 0.00000E+00 |
| Mirror 6 | 0.00000E+00 | 8.75134E−29 | −1.42696E−33 | 0.00000E+00 |

TABLE 3-continued

Optical data of Embodiment 3 according to FIG. 5a-5c

| Mirror 7 | 8.74402E−18 | −4.19879E−21 | 9.19439E−25 | 0.00000E+00 |
| Mirror 8 | −1.58322E−25 | 1.74889E−29 | −2.99873E−34 | 0.00000E+00 |

Where:
Object: The position of the object plane
Mirror 1: Mirror S1
Mirror 2: Mirror S2
Mirror 3: Mirror S3
Mirror 4: Mirror S4
Mirror 5: Mirror S5
Mirror 6: Mirror S6
Mirror 7: Mirror S7
Mirror 8: Mirror S8
STOP: aperture stop or diaphragm
Image: Position of the image plane
K: conical constant
A, B, C, D E, F, G; aspherical coefficients The upper, first part of Table 3 provides the general optical system data and the lower, second part the conical constant and the aspherical coefficients of each mirror surface.

FIG. 5c shows the distortion of the chief rays as a function of the field height, i.e. the y-direction or scanning direction of the field shown in FIG. 2 in the object plane. As apparent from FIG. 5c, the distortion is less than 10 nm.

FIG. 6 shows a fourth example of the embodiment of the invention. The same reference numbers apply to the same construction components as in FIGS. 3a to 5c. The system in accordance with FIG. 6 is a system having eight used areas N1, N2, N3, N4, N5, N6, N7 and N8, but only seven mirrors S1, S2, S3, S4, S5, S6, and S7, as the surface of the first mirror with the used areas N1 and N3 is employed twice. This allows the use of one less mirror. As one mirror can be dispensed with in this example of the embodiment, production costs can be reduced.

The image-side numerical aperture NA of the system or lens in accordance with FIG. 6 is 0.40 and the scan slit width is 3 mm, correlating with the width of the annular field in scan orientation.

The optical specifications in accordance with FIG. 6 are given in the following Table 4.

TABLE 4

Optical data of embodiment 4 according to FIG. 6

| Surface | Radius | Thickness | Mode |
|---|---|---|---|
| Object | INFINITY | 578.724 | |
| Mirror 1 | −581.864 | −443.615 | REFL |
| Mirror 2 | 5143.674 | 443.556 | REFL |
| Mirror 3 | −581.864 | −443.556 | REFL |
| Mirror 4 | −3202.338 | 301.549 | REFL |
| STOP | INFINITY | 839.439 | |
| Mirror 5 | −3363.853 | −714.456 | REFL |
| Mirror 6 | 1281.674 | 853.249 | REFL |
| Mirror 7 | 157.692 | −339.8 | REFL |
| Mirror 8 | 390.985 | 379.8 | REFL |
| Image | INFINITY | 0 | |

| Surface | K | A | B | C |
|---|---|---|---|---|
| Mirror 1 | 0.00000E+00 | 1.21362E−09 | −2.31278E−14 | 3.01500E−19 |
| Mirror 2 | 0.00000E+00 | −2.62732E−08 | 1.55172E−12 | 5.66333E−16 |
| Mirror 3 | 0.00000E+00 | 1.21362E−09 | −2.31278E−14 | 3.01500E−19 |
| Mirror 4 | 0.00000E+00 | 1.45633E−08 | −9.25861E−13 | 3.72142E−17 |
| Mirror 5 | 0.00000E+00 | −5.33008E−11 | −2.77433E−16 | 3.73061E−21 |
| Mirror 6 | 0.00000E+00 | −1.08411E−10 | 1.49838E−16 | 2.06980E−22 |
| Mirror 7 | 0.00000E+00 | 9.42477E−08 | 1.10318E−11 | 1.63255E−16 |
| Mirror 8 | 0.00000E+00 | 9.45004E−11 | 7.08191E−16 | 2.55199E−21 |

| Surface | D | E | F | G |
|---|---|---|---|---|
| Mirror 1 | −1.60886E−24 | 0.00000E+00 | 0.00000E+00 | 0.00000E+00 |
| Mirror 2 | 4.73642E−20 | 0.00000E+00 | 0.00000E+00 | 0.00000E+00 |
| Mirror 3 | −1.60886E−24 | 0.00000E+00 | 0.00000E+00 | 0.00000E+00 |
| Mirror 4 | −6.39474E−22 | 0.00000E+00 | 0.00000E+00 | 0.00000E+00 |
| Mirror 5 | 0.00000E+00 | 0.00000E+00 | 0.00000E+00 | 0.00000E+00 |
| Mirror 6 | 0.00000E+00 | 0.00000E+00 | 0.00000E+00 | 0.00000E+00 |

TABLE 4-continued

Optical data of embodiment 4 according to FIG. 6

| Mirror 7 | 2.55464E−19 | 0.00000E+00 | 0.00000E+00 | 0.00000E+00 |
| Mirror 8 | 8.24980E−26 | 0.00000E+00 | 0.00000E+00 | 0.00000E+00 |

Where:
Object: The position of the object plane
Mirror 1: Mirror S1
Mirror 2: Mirror S2
Mirror 3: mirror S3
Mirror 4: Mirror S4
Mirror 5: Mirror S5
Mirror 6: Mirror S6
Mirror 7: Mirror S7
Mirror 8: Mirror S8
STOP: aperture stop or diaphragm
Image: Position of the image plane
K:: conical constant
A, B, C, D, E, F, G: aspherical coefficients The upper, first part of Table 4 provides the general optical system data and the lower, second part the conical constant and the aspherical coefficients of each single mirror surfaces.

FIG. 7 shows a projection exposure system for microlithography with a projection lens in accordance with the invention having eight used areas 200. The illumination system 202 is a illumination system as described for instance in EP 99106348.8 with the title "Beleuchtungssystem, insbesondere für die EUV-Lithographie" or in U.S. Pat. No. 6,198,793 B1 with the title "Illumination system particularly for EUV-Lithography", with the content of their disclosure having been fully incorporated into the present application. An illumination system of this kind comprises an EUV light source 204. The light from the EUV light source is collected by the collector mirror 206. The reticle 212 is illuminated by means of a first mirror 207 comprising raster elements—so-called field honeycombs—and a second mirror 208 comprising raster elements—so-called pupil honeycombs—and also a mirror 210. The light reflected from the reticle 212 is imaged by means of the projection lens in accordance with the invention on a substrate 214 comprising a photosensitive coating.

The invention discloses a projection lens or projection system for the first time that features the application of an iris diaphragm as the aperture stop especially in a catoptric projection system for e.g. EUV wavelengths within $\lambda=11$ to 30 nm, constituting a particularly advantageous and compact projection lens or projection system from technical design and manufacturing points of view.

Moreover, the projection system presented features a large aperture with a simultaneous vignette-free and/or obscuration-free optical path. This culminates in a vignette-free exit pupil.

In particular, the invention discloses for the first time microlithography projection lenses for wavelengths ≤248 nm, preferably ≤193 nm, in particular for EUV lithography for wavelengths ranging from 1-30 nm for imaging an object field in an object plane onto an image field in an image plane, which are developed in such a manner that provision is made for an accessible diaphragm plane, into which for instance an iris diaphragm can be introduced.

The invention claimed is:

1. A projection system having an optical axis and configured so that during operation the projection system images an object field in an object plane onto an image field in an image plane, the projection system comprising:
a first mirror having a first used area;
a second mirror having a second used area;
a third mirror having a third used area; and
a diaphragm,
wherein:
the projection system is a microlithography projection system;
during operation, rays of a light beam pass through the microlithography projection system from the object plane to the image plane along an optical path impinges upon the first, second, and third used areas, respectively;
the optical path includes a first section between the first used area and the second used area;
the optical path includes a second section between the second used area and the third used area;
the light beam traverses the first section before traversing the second section;
the diaphragm is arranged in a diaphragm plane of the projection system in the second section of the optical path;
a distance along a radial direction from a center of the diaphragm to a position where the first section of the optical path passes the diaphragm plane is greater or equal than 10% of a construction length of the microlithography projection system; and
the construction length is defined as a distance between the object field and the image field measured along the optical axis.

2. The projection system in of claim 1, wherein the diaphragm is an iris diaphragm.

3. The projection system of claim 1, further comprising a fourth mirror having a fourth used area.

4. The projection system of claim 3, further comprising a fifth mirror having a fifth used area.

5. The projection system of claim 4, further comprising a sixth mirror having a sixth used area.

6. The projection system of claim 5, further comprising a seventh mirror having a seventh used area.

7. The projection system of claim 1, wherein the numerical aperture of the projection system at the image is greater than 0.26.

8. The projection system of claim 1, wherein the projection system has at least one intermediate image.

9. The projection system of claim 1, wherein the projection system has at least two intermediate images.

10. The projection system of claim 1, wherein the projection system is a catoptric projection system.

11. The projection system of claim 1, wherein the projection system is a catadioptric projection system.

12. The projection system of claim 1, wherein during operation the projection system images an object at the object field to the image field with light having a wavelength $\lambda \leq 193$ nm.

13. The projection system of claim 12, wherein $\lambda$ is in a range from 1 nm to 30 nm.

14. The projection system of claim 1, wherein, other than in the first section of the optical path, the optical path passes the diaphragm plane on only one side of the diaphragm.

15. A system comprising:
an illumination system; and
the projection system of claim 1,
wherein the system is a microlithography projection exposure system.

16. A projection system having an optical axis and configured so that during operation the microlithography projection system images an object field in an object plane onto an image field in an image plane, the projection system comprising:
a first mirror having a first used area;
a second mirror having a second used area;
a third mirror having a third used area; and
a diaphragm,
wherein:
the projection system is a microlithography projection system;
during operation, rays of a light beam pass through the projection system from the object plane to the image plane along an optical path impinges upon the first, second, and third used areas, respectively;
the optical path includes a first section between the first used area and the second used area;
the optical path includes a second section between the second used area and the third used area;
the light beam traverses the first section before traversing the second section; and
the diaphragm is in a diaphragm plane of the projection system in the second section of the optical path;
a distance along a radial direction from a center of the diaphragm to a position where the first section of the optical path passes the diaphragm plane is greater than 12% of a construction length of the microlithography projection system; and
the construction length is defined as a distance between the object field and the image field measured along the optical axis.

17. The projection system of claim 16, wherein, other than in the second section of the optical path, the optical path passes the diaphragm plane on only one side of the diaphragm.

18. A system comprising:
an illumination system; and
the projection system of claim 16,
wherein the system is a microlithography projection exposure system.

19. A projection system having an optical axis and configured so that during operation the microlithography projection system images an object field in an object plane onto an image field in an image plane, the projection system comprising:
a first mirror having a first used area;
a second mirror having a second used area;
a third mirror having a third used area;
a fourth mirror having a fourth used area; and
a diaphragm,
wherein:
the projection system is a microlithography projection system;
during operation, rays of a light beam pass through the projection system from the object plane to the image plane along an optical path impinges upon the first, second, third, and fourth used areas, respectively;
the optical path includes a first section between the first used area and the second used area;
the optical path includes a second section between the second used area and the third used area;
the optical path includes a third section between the third used area and the fourth used area;
the light beam traverses the first section before traversing the second section;
the light beam traverses the second section before traversing the third section; and
the diaphragm is in a diaphragm plane of the projection system in the third section of the optical path;
a first distance along a radial direction from a center of the diaphragm to a position where the first section of the optical path passes the diaphragm plane is greater than 12% of a construction length of the projection system;
a second distance along a radial direction from a center of the diaphragm to a position where the third section of the optical path passes the diaphragm plane is greater than 16% of the construction length of the projection system; and
the construction length is defined as a distance between the object field and the image field measured along the optical axis.

20. The projection system of claim 19, wherein, other than in the second section of the optical path, the optical path passes the diaphragm plane on only one side of the diaphragm.

21. A system comprising:
an illumination system; and
the projection system of claim 19,
wherein the system is a microlithography projection exposure system.

* * * * *

UNITED STATES PATENT AND TRADEMARK OFFICE
CERTIFICATE OF CORRECTION

Page 1 of 1

PATENT NO. : 9,146,472 B2
APPLICATION NO. : 14/080224
DATED : September 29, 2015
INVENTOR(S) : Hans-Juergen Mann It is certified that error appears in the above-identified patent and that said Letters Patent is hereby corrected as shown below:

Specification

Column 4, Line 38, delete "a a" insert --a--;

Claims

Column 22, Line 47, Claim 2, delete "in of" insert --of--.

Signed and Sealed this
Fifteenth Day of March, 2016

Michelle K. Lee
*Director of the United States Patent and Trademark Office*